United States Patent
Zhang

(10) Patent No.: US 11,450,807 B2
(45) Date of Patent: Sep. 20, 2022

(54) TADF POLYMER AND QUANTUM DOT MATERIAL, METHODS OF PREPARING THE SAME, AND APPLICATIONS THEREOF

(71) Applicant: BOE TECHNOLOGY GROUP CO., LTD., Beijing (CN)

(72) Inventor: Zhenqi Zhang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 481 days.

(21) Appl. No.: 16/457,843

(22) Filed: Jun. 28, 2019

(65) Prior Publication Data

US 2020/0028090 A1 Jan. 23, 2020

(30) Foreign Application Priority Data

Jul. 19, 2018 (CN) .......................... 201810799122.X

(51) Int. Cl.
  *H01L 51/00* (2006.01)
  *C09K 11/06* (2006.01)
  *H01L 51/50* (2006.01)

(52) U.S. Cl.
  CPC .......... *H01L 51/0067* (2013.01); *C09K 11/06* (2013.01); *H01L 51/0072* (2013.01); *H01L 51/5016* (2013.01); *C09K 2211/1059* (2013.01)

(58) Field of Classification Search
  CPC ............. H01L 51/0038; H01L 51/0042; H01L 51/0043; H01L 51/502
  See application file for complete search history.

(56) References Cited

U.S. PATENT DOCUMENTS

| | | |
|---|---|---|
| 2016/0240785 A1 | 8/2016 | Cass et al. |
| 2017/0358751 A1 | 12/2017 | Pan et al. |
| 2019/0214577 A1* | 7/2019 | Pan ....................... C07D 209/86 |

FOREIGN PATENT DOCUMENTS

| | | | | |
|---|---|---|---|---|
| CN | 106117524 A | 11/2016 | | |
| CN | 106589324 A | 4/2017 | | |
| CN | 107118334 A | 9/2017 | | |
| CN | 107814916 A | 3/2018 | | |
| CN | 110746409 A * | 2/2020 | ........... | C07D 251/24 |
| WO | 2016086886 A1 | 6/2016 | | |

OTHER PUBLICATIONS

First Chinese Office Action issued in corresponding Chinese Application No. 201810799122.X, dated Apr. 23, 2020, with English language translation.

Chensen Li et al., "Thermally Activated Delayed Fluorescence Pendant Copolymers with Electron—and Hole-Transporting Spacers," American Chemical Society Applied Materials and Interfaces, dated Jan. 23, 2018, vol. 10, pp. 5731-5739.

* cited by examiner

*Primary Examiner* — Michael M Dollinger
(74) *Attorney, Agent, or Firm* — McDermott Will & Emery LLP

(57) ABSTRACT

A TADF polymer includes a main chain, and at least one TADF reactive group and at least one quantum dot coordinating group respectively grafted onto the main chain.

20 Claims, 4 Drawing Sheets

TADF POLYMER AND QUANTUM DOT MATERIAL, METHODS OF PREPARING THE SAME, AND APPLICATIONS THEREOF

CROSS-REFERENCE TO RELATED APPLICATION

This application claims priority to Chinese Patent Application No. 201810799122.X, filed on Jul. 19, 2018, titled "TADF POLYMER LIGAND AND QUANTUM DOT MATERIAL, METHODS OF PREPARING THE SAME, AND APPLICATIONS THEREOF", which is incorporated herein by reference in its entirety.

TECHNICAL FIELD

The present disclosure relates to the field of quantum dot material technologies, and in particular, to a TADF polymer and a quantum dot material, methods of preparing the same, and applications thereof.

BACKGROUND

With the development of display technologies, quantum dot light-emitting diodes (QLED) have gradually become one of the mainstream development directions of display technologies in the future due to their self-luminous properties (no additional light sources are required), narrow luminous peaks, adjustable luminous colors, and high luminous efficiencies.

SUMMARY

In a first aspect, a (thermally activated delayed fluorescence) TADF polymer is provided. The TADF polymer includes a main chain, and at least one TADF reactive group and at least one quantum dot coordinating group respectively grafted onto the main chain.

In some embodiments, each of the at least one TADF reactive group includes: at least one electron-donating group; and at least one electron-withdrawing group correspondingly bonded to the at least one electron-donating group. The at least one electron-donating group includes at least one aromatic group.

In some embodiments, each of the at least one aromatic group includes at least one of a carbazolyl group, a diphenylamino group, a triphenylamino group, or a phenothiazine group. Each of the electron-withdrawing group includes at least one of a triazine group, a sulfone group, a cyano group, or a phenyl polycyano group.

In some embodiments, the main chain includes a plurality of aromatic groups. The at least one TADF reactive group and the main chain share at least one of the at least one aromatic group.

In some embodiments, each of the at least one quantum dot coordinating group includes: at least one of amino group(s), hydroxyl group(s), carboxyl group(s), mercapto group(s), thioether group(s), phosphino group(s), or phosphinyl group(s).

In some embodiments, the TADF polymer further includes at least one solubilizing group grafted onto the main chain.

In some embodiments, each of the at least one solubilizing group includes at least one of ethyl group(s), n-butyl group(s), t-butyl group(s), n-octyl group(s), tert-butylphenyl group(s), methoxy group(s), or n-butoxy group(s).

In some embodiments, a chemical structural formula of the TADF polymer is:

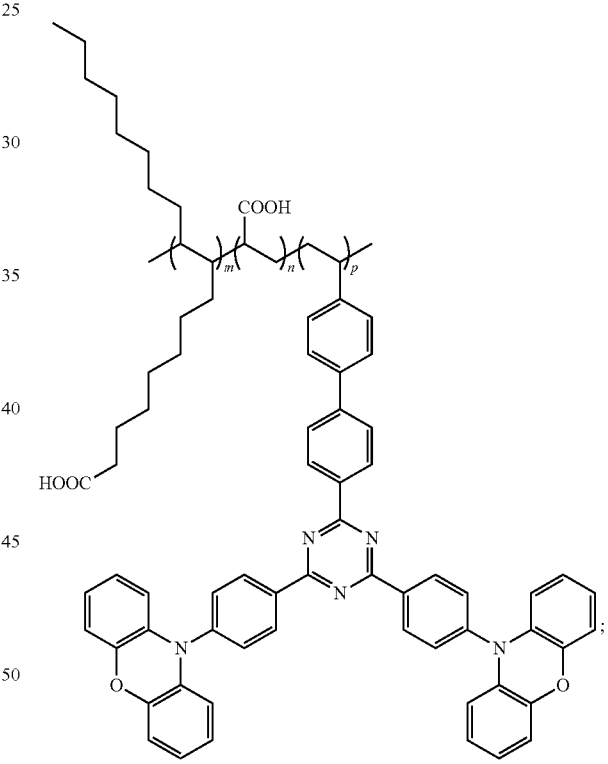

wherein p is a number of TADF reactive groups grafted onto the main chain, n is a number of quantum dot coordinating groups grafted onto the main chain, and m is a number of solubilizing groups grafted onto the main chain.

In some embodiments, a chemical structural formula of the TADF polymer is:

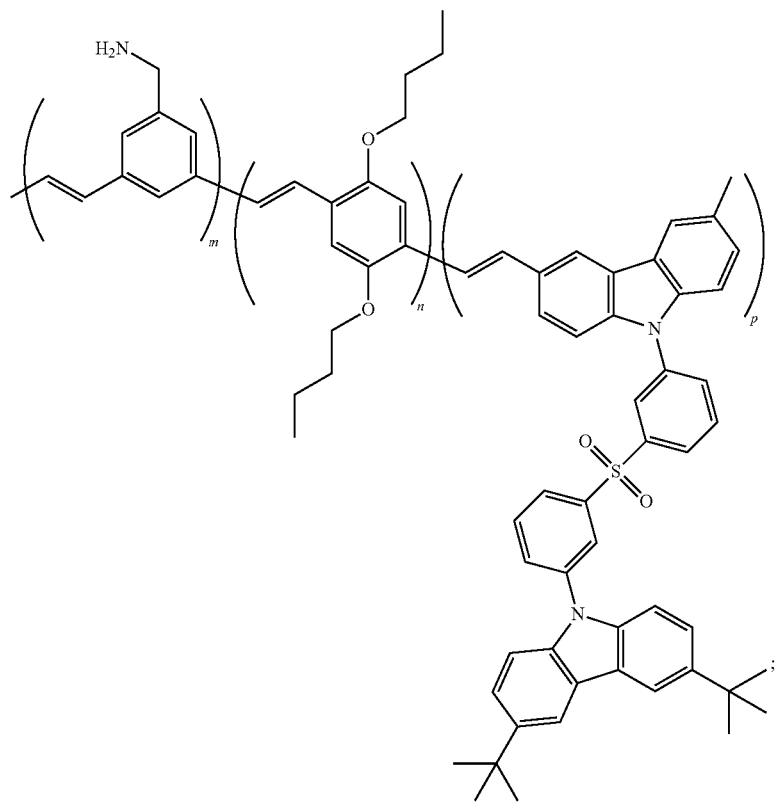

wherein p is a number of TADF reactive groups grafted onto the main chain, n is a number of quantum dot coordinating groups grafted onto the main chain, and m is a number of solubilizing groups grafted onto the main chain.

In some embodiments, the main chain includes a main chain formed by polymerization from at least one of an ester, an ether, an amide, or a hydrocarbon compound.

In some embodiments, the hydrocarbon compound includes at least one of an alkane, an alkene, an alkyne, or an aromatic compound. The aromatic compound includes at least one of benzene ring(s), furan(s), thiophene(s), carbazole(s), triphenylamine(s), fluorene(s), or spirofluorene(s).

In some embodiments, the main chain includes one of a homopolymer main chain, an alternating copolymer main chain, an atactic copolymer main chain, a block copolymer main chain, or a graft copolymer main chain.

In another aspect, a method of preparing a TADF polymer is provided, which is used for preparing the TADF polymer described above. The method includes: preparing a main compound for forming a main chain, a TADF compound, and a quantum dot coordinating compound respectively; mixing the main compound, the TADF compound and the quantum dot coordinating compound to perform reaction(s); and obtaining a product of the reaction as a TADF polymer.

Or, preparing a main compound for forming a main chain and a TADF compound respectively, at least one of the main compound and the TADF compound containing at least one quantum dot coordinating group; mixing the main compound and the TADF compound to perform reaction(s); and obtaining a product of the reaction as a TADF polymer;

Or, preparing a main compound for forming a main chain and a quantum dot coordinating group respectively, the main compound containing at least one TADF reactive group; mixing the main compound and the quantum dot coordinating compound to perform reaction(s); and obtaining a product of the reaction as a TADF polymer.

In some embodiments, the step of preparing a TADF compound includes: preparing an aromatic compound and an electron-withdrawing compound respectively; dissolving the aromatic compound and the electron-withdrawing compound in an organic liquid to perform reaction(s); obtaining a product of the reaction; and purifying the product of the reaction to obtain a TADF compound;

Or, the step of preparing a main compound for forming a main chain, the main compound containing at least one TADF reactive group, includes: preparing an initial compound for forming a main chain, and an electron-withdrawing compound respectively, the initial compound containing at least one aromatic group; dissolving the initial compound and the electron-withdrawing compound in an organic liquid to perform reaction(s); obtaining a product of the reaction; and purifying the product of the reaction to obtain a main compound containing at least one TADF reactive group.

In yet another aspect, a quantum dot material is provided. The quantum dot material includes: quantum dots; and the TADF polymer according to the above technical solution. The quantum dots are combined with the TADF polymer through the at least one quantum dot coordinating group in the TADF polymer.

In some embodiments, an emission spectrum of the TADF polymer at least partially overlaps with an absorption spectrum of the quantum dots; or, the emission spectrum of the TADF polymer at least partially overlaps with an excitation spectrum of the quantum dots.

In some embodiments, the quantum dots include cadmium quantum dots or cadmium-free quantum dots.

The cadmium quantum dots include: at least one of cadmium sulfide quantum dots, cadmium selenide quantum dots, cadmium telluride quantum dots, or zinc sulfide quantum dots; or, quantum dots having an alloy structure with cadmium sulfide, cadmium selenide or cadmium telluride cores; or, quantum dots having a core-shell structure with cadmium sulfide, cadmium selenide or cadmium telluride cores.

The cadmium-free quantum dots include: at least one of zinc selenide quantum dots, indium phosphide quantum dots, lead sulfide quantum dots, copper indium sulfur quantum dots, zinc oxide quantum dots, perovskite oxides quantum dots, zinc sulfide quantum dots, indium arsenide quantum dots, indium gallium arsenide quantum dots, indium gallium nitride quantum dots, gallium nitride quantum dots, zinc telluride quantum dots, silicon quantum dots, germanium quantum dots, or carbon quantum dots; or, quantum dots having an alloy structure with zinc selenide, indium phosphide, lead sulfide, copper indium sulfide, zinc oxide, perovskite oxides, indium arsenide, indium gallium arsenide, indium gallium nitride, gallium nitride, zinc telluride, silicon, germanium, or carbon cores; or, quantum dots having a core-shell structure with zinc selenide, indium phosphide, lead sulfide, copper indium sulfide, zinc oxide, perovskite oxides, indium arsenide, indium gallium arsenide, indium gallium nitride, gallium nitride, zinc telluride, silicon, germanium, or carbon cores.

In yet another aspect, a method of preparing a quantum dot material is provided, which is used for preparing the quantum dot material described above. The method includes: preparing the TADF polymer in accordance with the method of preparing a TADF polymer described above; dissolving quantum dots and the TADF polymer in an organic liquid to perform reaction(s); and obtaining a precipitate of the reaction as a quantum dot material.

In yet another aspect, a quantum dot light-emitting diode (QLED) device is provided. The QLED device includes a quantum dot light-emitting layer. A material forming the quantum dot light-emitting layer includes the quantum dot material described in the above technical solution.

In yet another aspect, a display device is provided, which includes at least one QLED device described above.

BRIEF DESCRIPTION OF THE DRAWINGS

The accompanying drawings described herein are intended to provide a further understanding of some embodiments of the present disclosure and constitute a part of embodiments of the present disclosure. The illustrative embodiments of the present disclosure and the description thereof serve to explain the present disclosure, but do not constitute an undue limitation of the present disclosure. In the accompanying drawings.

DETAILED DESCRIPTION

The technical solutions in some embodiments of the present disclosure will be described clearly and completely with reference to the accompanying drawings in some embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

At present, illumination of quantum dot light-emitting diodes (QLED) is mainly realized in two ways. In one way, carriers are directly injected to cause illumination. That is, holes are injected from a hole transport layer in a QLED device into a quantum dot light-emitting layer in the QLED device, and electrons are injected from an electron transport layer in the QLED device into the quantum dot light-emitting layer in the QLED device, then the holes and the electrons are recombined into excitons in the quantum dot light-emitting layer in the QLED device to emit light. In another way, energy is transferred to cause illumination. That is, excitons formed by recombination of the holes and electrons directly transfer energy to quantum dots in the quantum dot light-emitting layer of the QLED device, so as to excite the quantum dots to emit light.

Molecules of thermally activated delayed fluorescence (TADF) materials, a special kind of organic luminescent material, have a smaller energy level difference between singlet state S1 and triplet state T1 than molecules of conventional organic luminescent materials. Triplet excitons of TADF materials can be converted into singlet excitons by a reverse intersystem crossing (RISC) process after absorbing the heat in the environment, thereby improving a luminous efficiency thereof.

Figure 1:
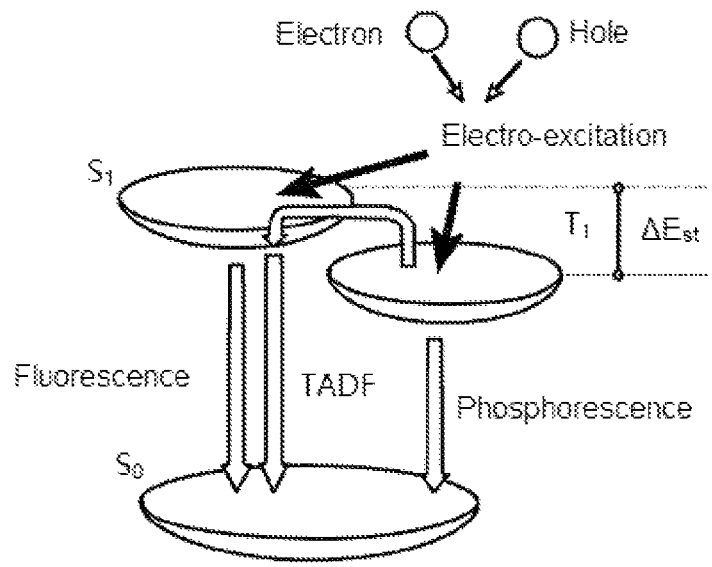
FIG. 1 is a schematic diagram showing luminescence mechanisms of a conventional organic luminescent material and a TADF material.

Illustratively, luminous mechanisms of a conventional organic luminescent material and a TADF material are shown in FIG. 1. Electrons and holes of an organic luminescent material form excitons after electro-excitation, and the excitons are usually in an unstable high-energy state and need to return to a ground state S0. If the excitons return to the ground state S0 from the singlet state S1 in a radiation transition, the organic luminescent material emits fluorescence. If the excitons return to the ground state S0 from the triplet state T1 in a radiation transition, the organic luminescent material emits phosphorescence.

However, a spin direction of triplet T1 excitons is opposite to a spin direction of ground state S0 excitons. A singlet S1 energy level of conventional organic luminescent materials is generally 0.5 eV-1.0 eV ("eV" stands for "electron volt") higher than a triplet T1 energy level thereof. That is, an energy level difference $\Delta E_{st}$ between singlet state S1 and triplet state T1 of conventional organic luminescent materials is usually 0.5 eV-1.0 eV. Since the spin direction of triplet T1 excitons is opposite to the spin direction of ground state S0 excitons, it is difficult for triplet T1 excitons of conventional organic luminescent materials to emit phosphorescence due to the forbidden transition. It is also impossible for the triplet T1 excitons to undergo the RISC process after absorbing the heat in the environment. As a result, a luminous efficiency of conventional organic luminescent materials is low.

TADF materials have a small energy level difference $\Delta E_{st}$ between singlet state S1 and triplet state T1. Triplet T1 excitons of TADF materials can be converted into singlet S1 excitons by the RISC process after absorbing the heat in the environment, at which cause the TADF materials to emit fluorescence. That is, TADF materials can realize thermally activated delayed fluorescence, which greatly improves the luminous efficiency of TADF materials.

Therefore, some embodiments of the present disclosure provide a TADF polymer. The TADF polymer is configured to be combined with quantum dots to form a new type of quantum dot material, so as to enhance an electro-luminescence efficiency of quantum dot materials.

Figure 2:
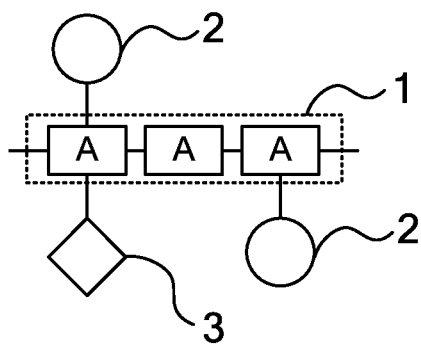
FIG. 2 is a schematic diagram showing a structure of a TADF polymer, in accordance with some embodiments of the present disclosure.

As shown in FIG. 2, the TADF polymer provided by some embodiments of the present disclosure includes a main chain 1, and at least one TADF reactive group 2 and at least one quantum dot coordinating group 4 respectively grafted onto the main chain 1.

Since at least one TADF reactive group 2 is grafted onto the main chain 1 of the TADF polymer, the at least one TADF reactive group 2 makes the TADF polymer exhibit TADF properties. Moreover, since at least one quantum dot coordinating group 3 is grafted onto the main chain 1 of the TADF polymer, the at least one quantum dot coordinating group 3 makes it possible for the TADF polymer to be combined with quantum dots by coordination bonds.

It will be noted that, FIG. 2 is only a schematic example of a structure of the TADF polymer, and does not limit grafting positions of various groups and a number of grafts in the TADF polymer.

The TADF polymer provided by some embodiments of the present disclosure may form a new type of quantum dot material after being combined with quantum dots by coordination bonds. The quantum dot material has utilized the TADF properties of the TADF polymer, i.e., properties that allow holes and electrons to be recombined into excitons in the TADF polymer. Therefore, the TADF polymer may emit light with a spectrum that overlaps with an absorption spectrum (or an excitation spectrum) of the quantum dots under an action of a voltage. As a result, energy of the TADF polymer may be transferred to the quantum dots by a means of energy transfer such as Foster resonance, and cause the quantum dots to emit light.

Therefore, after the TADF polymer provided by some embodiments of the present disclosure is combined with quantum dots by coordination bonds to form a quantum dot material, not only that the quantum dots may emit light by directly recombining holes and electrons into excitons in the quantum dots, but also the quantum dots may emit light due to energy transfer from the TAD F polymer to the quantum dots. As a result, the electro-luminescence efficiency of the quantum dot material may be effectively improved.

The main chain 1 is configured to serve as a backbone of the TADF polymer. As shown in FIG. 2, a chain unit (a chain unit is a basic unit constituting the main chain 1, and a plurality of basic units are sequentially joined to form the main chain 1) A of the main chain includes at least one of an ester, an ether, an amide, or a hydrocarbon compound. That is, the main chain 1 includes a main chain form by polymerization from at least one of an ester, an ether, an amide, or a hydrocarbon compound.

For example, the hydrocarbon compound includes at least one of an alkane, an alkene, an alkyne, or an aromatic compound. The aromatic compound includes at least one of benzene ring(s), furan(s), thiophene(s), carbazole(s), triphenylamine(s), fluorene(s), or spirofluorene(s).

In terms of a connection manner of the chain units A in the main chain 1, the main chain 1 includes one of a homopolymer main chain, an alternating copolymer main chain, an atactic copolymer main chain, a block copolymer main chain, or a graft copolymer main chain.

In some embodiments, functional groups of the main chain 1 generally include at least one of the following structures (1) to (19):

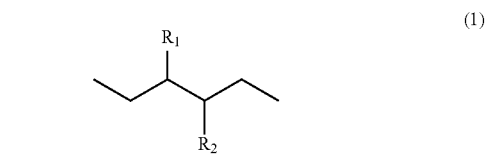

(1)

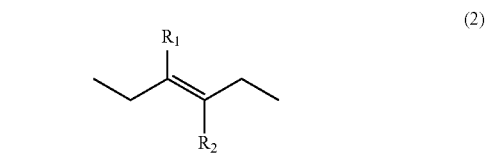

(2)

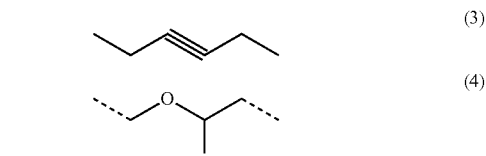

(3)

(4)

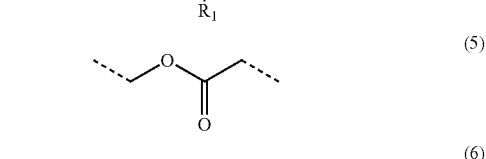

(5)

(6)

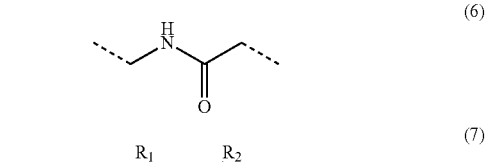

(7)

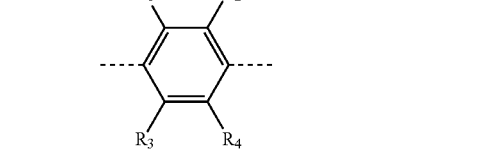

(8)

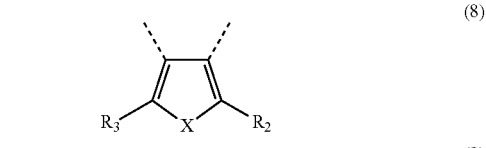

(9)

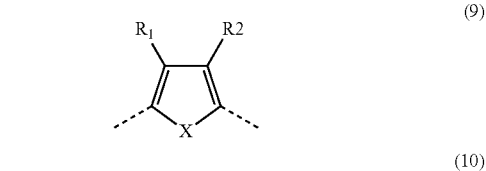

(10)

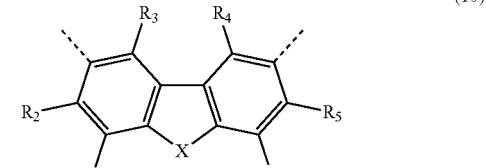

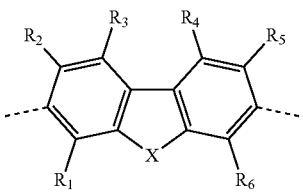
(11)

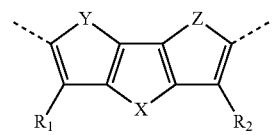
(12)

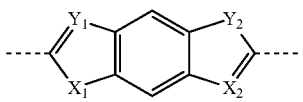
(13)

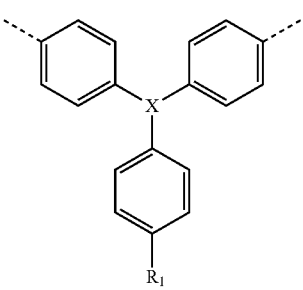
(14)

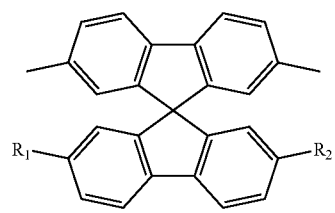
(15)

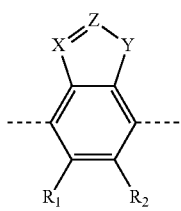
(16)

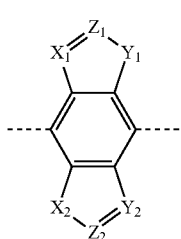
(17)

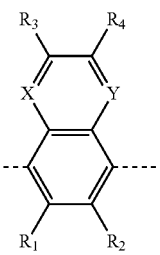
(18)

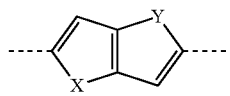
(19)

In the above functional groups (1) to (19), X, $X_1$, $X_2$, Y, $Y_1$, $Y_2$, Z, $Z_1$, and $Z_2$ each respectively represents an atom, such as carbon (C), oxygen (O), nitrogen (N), sulfur (S), silicon (Si), or other atoms; R, $R_1$, $R_2$, $R_3$, $R_4$, $R_5$, and $R_6$ each respectively represents a group, such as the TADF reactive group 2, the quantum dot coordinating group 3, a solubilizing group 4, a hydrocarbon group, an ester group, an ether group, an amide group, an aromatic group, or other groups.

In addition, in some embodiments, R, $R_1$, $R_2$, $R_3$, $R_4$, $R_5$, and $R_6$ each represents a hydrogen (H) atom.

The TADF reactive group 2 is configured to make the TADF polymer exhibit TADF properties as mentioned above, in some embodiments, each of the at least one TADF reactive group 2 includes at least one electron-donating group, and at least one electron-withdrawing group correspondingly bonded to the at least one electron-donating group. The at least one electron-donating group includes at least one aromatic group, And each electron-withdrawing group may be bonded to nitrogen atom(s) or spiro atom(s) in a corresponding aromatic group, or carbon atom(s) on a corresponding aromatic ring.

Herein, the description that the at least one electron withdrawing group is correspondingly bonded to the at least one electron donating group includes three situations: a single electron withdrawing group is bonded to a single electron donating group; or, a single electron withdrawing group is bonded to a plurality of electron donating groups; or, a plurality of electron withdrawing groups are bonded to a same electron donating group. Some embodiments of the present disclosure do not limit a connection manner thereof, as long as there is a corresponding connection relationship between the at least one electron withdrawing group and the at least one electron donating group.

For example, the aromatic group, which is an electron donor for the TADF reactive group 2, generally includes at least one of a carbazolyl group, a diphenylamino group, a triphenylamino group or a phenothiazine group. The electron-withdrawing group, which is an electron acceptor of the TADF reactive group 2, generally includes at least one of a triazine group, a sulfone group, a cyano group, or a phenylpolycyano group.

In some embodiments, the TADF reactive group 2 generally adopts any one of the following structures (1) to (4):

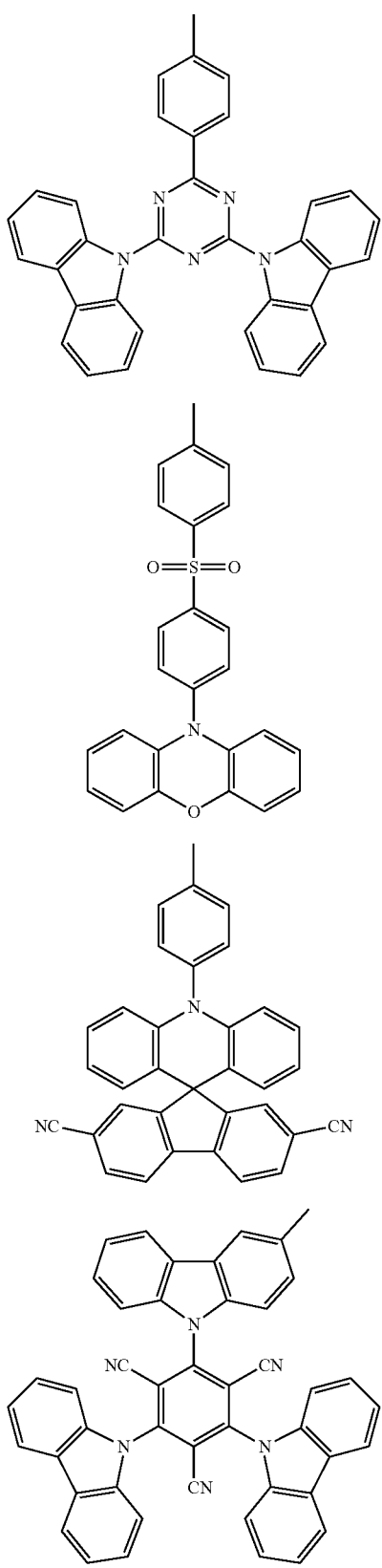

In some embodiments, the aromatic group generally adopts any one of the following structures (1) to (3):

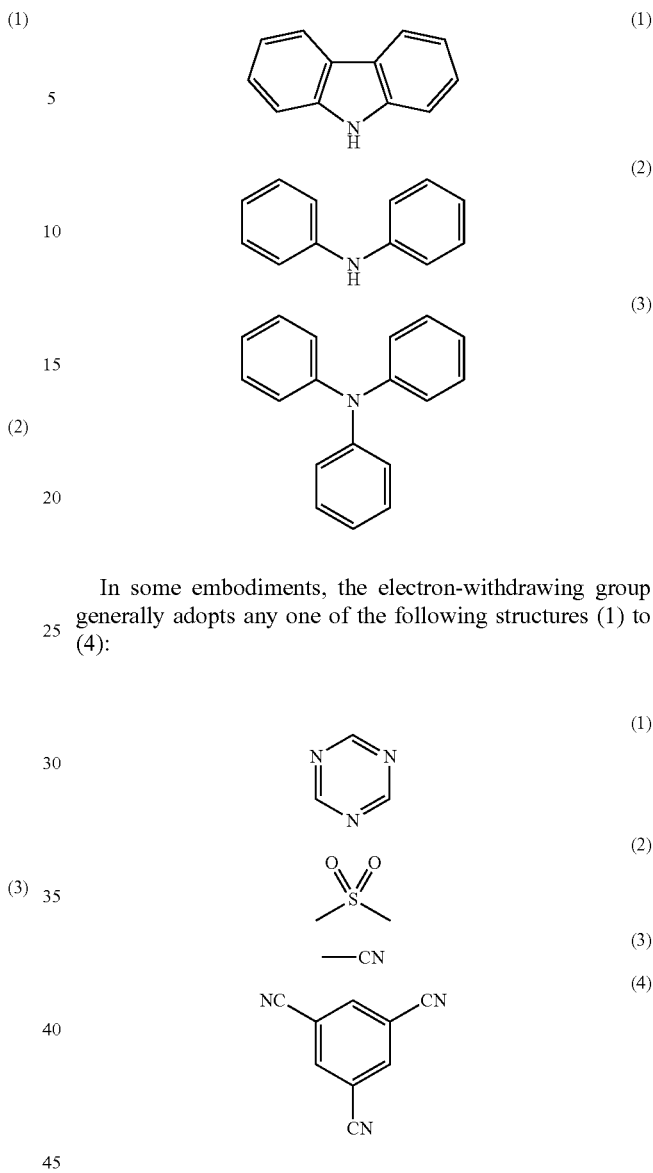

In some embodiments, the electron-withdrawing group generally adopts any one of the following structures (1) to (4):

In the TADF polymer provided by some embodiments of the present disclosure, the aromatic group is used as an electron donor of the TADF reactive group 2, an electron-withdrawing group is used as an electron acceptor of the TADF reactive group 2; and the electron-withdrawing group is bonded to nitrogen atom(s) or spiro atom(s) in an aromatic group, or carbon atom(s) on an aromatic ring. In this way, a large steric hindrance may be formed by using the nitrogen atom, the spiro atom, or the carbon atom on the aromatic ring, that is, a large dihedral angle is formed between the electron donor and the electron acceptor. Therefore, it may be ensured that a HOMO (Highest Occupied Molecular) orbital of the electron donor and a LUMO (Lowest Unoccupied Molecular) orbital of the electron acceptor are separated, in this way, the HOMO orbital and LUMO orbital have few overlapping edges, so that an energy level difference $\Delta E_{st}$ between single state S1 and triplet state T1 of the TADF polymer is small. As a result, triplet excitons in the TADF polymer may be able to undergo the RISC process effectively and rapidly, thereby improving the luminous efficiency.

It will be understood that, in a case where the main chain 1 includes a plurality of aromatic groups, the at least one TADF reactive group 2 and the main chain 1 may share at least one aromatic group. That is to say, the at least one aromatic group in the main chain 1 may be a component of the at least one TADF reactive group 2. That is, the electron-withdrawing group is directly bonded to the main chain 1, and the aromatic group and the electron-withdrawing group in the main chain 1 together form a TADF reactive group 2. In this way, materials for preparing the TADF polymer may be saved, and a preparing process of the TADF polymer may be simplified.

The quantum dot coordinating group 3 is configured to be combined with quantum dots through coordination bonds, and generally includes functional group(s) or atom(s) that can be bonded to surfaces of the quantum dots.

For example, each quantum dot coordinating group 3 includes at least one of amino group(s), hydroxyl group(s), carboxyl group(s), mercapto group(s), thioether group(s), phosphino group(s), or phosphinyl group(s). A number of each group is not limited and may be one or more.

In general, a coordination strength of a phosphorus (P) atom is greater than a coordination strength of a sulfur (S) atom; the coordination strength of the sulfur (S) atom is greater than a coordination strength of a nitrogen (N) atom; and the coordination strength of the nitrogen (N) atom is greater than a coordination strength of an oxygen (O) atom. The coordination strength refers to a strength of the coordination bond formed by electrons from the atom. In the quantum dot coordinating group 3, a group with a suitable coordination strength may be selected according to an actual requirement for the quantum dots.

Figure 3:
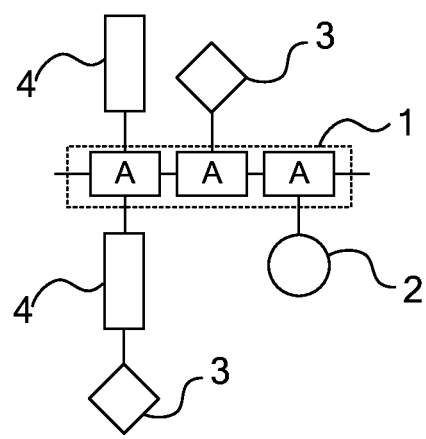
FIG. 3 is a schematic diagram showing another structure of a TADF polymer, in accordance with some embodiments of the present disclosure.

As shown in FIG. 3, in some embodiments, the TADF polymer further includes at least one solubilizing group 4 grafted onto the main chain 1. The at least one solubilizing group 4 may be used to effectively adjust a solubility of the TADF polymer.

For example, the solubilizing group includes at least one of ethyl group(s), n-butyl group(s), t-butyl group(s), n-octyl group(s), tert-butylphenyl group(s), methoxy group(s), or n-butoxy group(s).

The type of solubilizing group 4 depends on an application environment of the TADF polymer. In a case where the TADF polymer is applied in a polar solvent, the solubilizing group 4 is a polar solubilizing group; in a case where the TADF polymer is applied in a non-polar solvent, the solubilizing group 4 is a non-polar solubilizing group.

Of course, if the TADF polymer already has a good solubility before the solubilizing group 4 is added, it may be unnecessary to provide an additional solubilizing group 4 in the TADF polymer.

Figure 4:
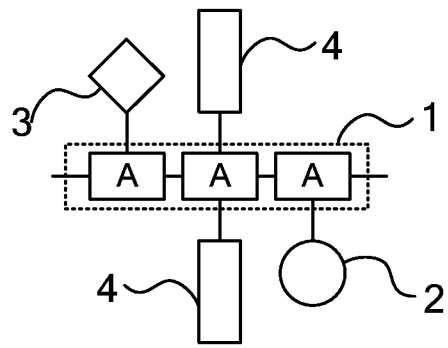
FIG. 4 is a schematic diagram showing yet another structure of a TADF polymer, in accordance with some embodiments of the present disclosure.

It will be noted that, in the TADF polymer provided in the above some embodiments, graft ratios and grafting positions of the TADF reactive group 2, the quantum dot coordinating group 3, and the solubilizing group 4 on the main chain 1 may be set according to a structure of the main chain 1, as shown in FIG. 2, FIG. 3, FIG. 4, etc., which is not limited by some embodiments of the present disclosure.

Some embodiments of the present disclosure further provide a method of preparing a TADF polymer, which is used for preparing the TADF polymer described above.

Figure 5:
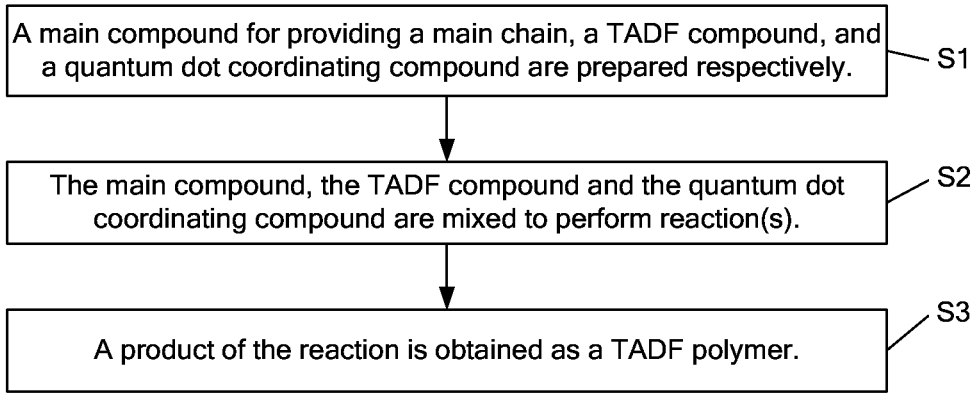
FIG. 5 is a flow diagram of a method of preparing a TADF polymer, in accordance with some embodiments of the present disclosure.

In some embodiments, as shown in FIG. 5, the method includes step 1 step 3 (S1~S3).

In S1, a main compound for forming a main chain, a TADF compound, and a quantum dot coordinating compound are prepared respectively.

In S2, the main compound, the TADF compound and the quantum dot coordinating compound are mixed to perform reaction(s).

In S3, a product of the reaction is obtained as a TADF polymer.

Since a TADF polymer has TADF properties, a TADF polymer is obtained means that a TADF polymer with TADF properties is obtained.

In S2, the reaction between the above compounds may be one or more according to the different structures of the compounds, which is not limited by some embodiments of the present disclosure.

It will be understood that, after obtaining the product of the reaction of the main compound, the TADF compound and the quantum dot coordinating compound, the product may be further purified. For example, the product may be dissolved in toluene form a solution, and then methanol is added to the solution. This process may be repeated several times to obtain a purified TADF polymer.

The main compound and the quantum dot coordinating compound are respectively synthesized according to their respective structural compositions, and preparation methods thereof are not limited by some embodiments of the present disclosure. The TADF compound includes the TADF reactive group provided by some of the above embodiments, and a preparation method thereof is selected according to a structure of the TADF reactive group.

In some other embodiments, if at least one of the main compound for forming a main chain and the TADF compound includes a quantum dot coordinating group, then there is no need to prepare an additional quantum dot coordinating compound. The main compound and the TADF compound may be directly mixed to perform reaction(s), so as to obtain a product of the reaction, which will be a TADF polymer.

Figure 6:
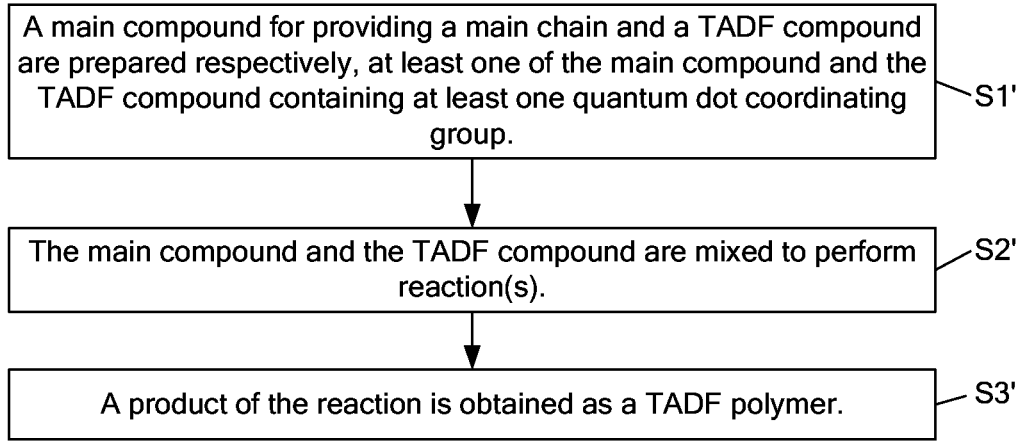
FIG. 6 is a flow diagram of another method of preparing a TADF polymer, in accordance with some embodiments of the present disclosure.

Based on this, as shown in FIG. 6, the method includes step 1'-step 3' (S1'~S3').

In S1', a main compound for forming a main chain and a TADF compound are prepared respectively, at least one of the main compound and the TADF compound containing at least one quantum dot coordinating group.

In S2', the main compound and the TADF compound are mixed to perform reaction(s).

In S3', a product of the reaction is obtained as a TADF polymer.

It will be understood that, in S2', the reaction between the above compounds may be one or more according to the different structures of the compounds, which is not limited by some embodiments of the present disclosure.

In some embodiments, each TADF reactive group 2 included in the TADF polymer to be formed includes at least one electron-donating group, and at least one electron-withdrawing group correspondingly bonded to the at least one electron-donating group. The at least one electron-donating group includes at least one aromatic group.

Figure 7:
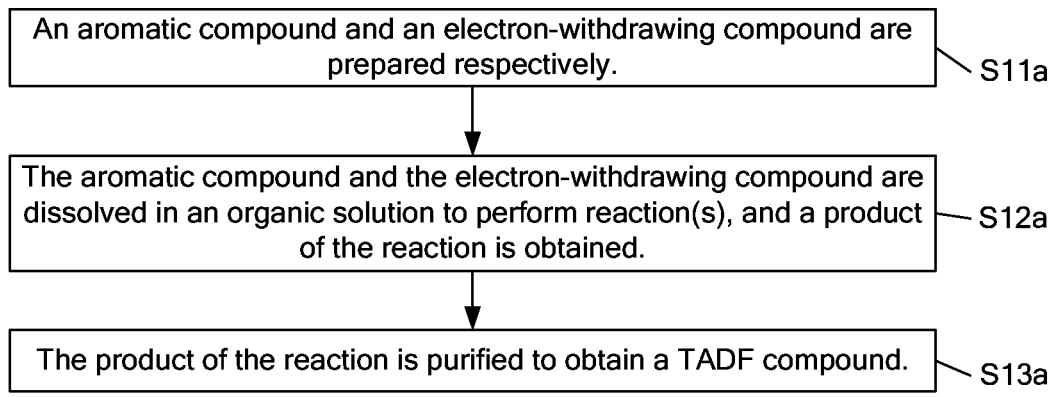
FIG. 7 is a flow diagram of a method of preparing a TADF compound, in accordance with some embodiments of the present disclosure.

Based on this, as shown in FIG. 7, the step of preparing the TADF compound includes step 11a to step 13a (S11a~S13a).

In S11a, an aromatic compound and an electron-withdrawing compound are prepared respectively.

Preparation methods of the aromatic compound and the electron-withdrawing compound are selected according to respective structural compositions thereof, and are not limited by some embodiments of the present disclosure.

In S12a, the aromatic compound and the electron-withdrawing compound are dissolved in an organic liquid to perform reaction(s), and a product of the reaction is obtained.

In some embodiments of the present disclosure, after the aromatic compound and the electron-withdrawing compound are dissolved and mixed in an organic liquid to form an organic solution, at least one of an initiator and a catalyst may be added to the organic solution according to actual situations; and reaction conditions, such as a reaction temperature, a reaction time, and whether to adopt an extraction process, may be set, so as to obtain a product of the reaction after the aromatic compound and the electron-withdrawing compound react under a preset reaction condition.

Herein, the type of the organic liquid depends on types of the aromatic compound and the electron-withdrawing compound, which is not limited by some embodiments of the present disclosure.

In S13a, the product of the reaction is purified to obtain a TADF compound.

The product of the above reaction is usually purified by a purification method such as a column chromatography purification method, a recrystallization purification method, or a chromatography technology purification method.

For example, the above S11a~S13a may be applied to at least one of S1 and S1' above mentioned.

In some other embodiments, if the main compound for forming a main chain contains a TADF compound, then there is no need to prepare an additional TADF compound. The main compound containing a TADF compound and the quantum dot coordinating compound may be directly mixed to perform reaction(s), so as to obtain a product of reaction, which will be a TADF polymer.

Figure 8:
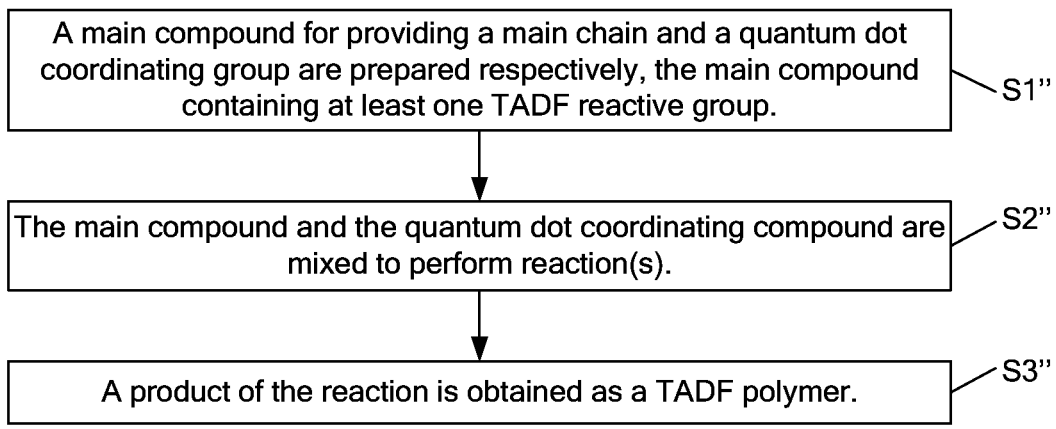
FIG. 8 is a flow diagram of yet another method of preparing a TADF polymer, in accordance with some embodiments of the present disclosure.

Based on this, as shown in FIG. 8, the method includes step 1"~step 3" (S1"~S3").

In S1", a main compound for forming a main chain and a quantum dot coordinating group are prepared respectively, the main compound containing at least one TADF reactive group.

In S2", the main compound and the quantum dot coordinating compound are mixed to perform reaction(s).

In S3", a product of the reaction is obtained as a TADF polymer.

Herein, the step of preparing a main compound for forming a main chain, the main compound containing at least one TADF reactive group, includes step 11b step 13b (S11b~S13b) below.

In S11b, an initial compound for forming a main chain, and an electron-withdrawing compound are prepared respectively, the initial compound containing at least one of aromatic group.

In S12b, the initial compound and the electron-withdrawing compound are dissolved in an organic liquid to perform reaction(s).

In S13b, a product of the reaction is purified to obtain a main compound containing at least one TADF reactive group.

It will be understood that, in the above S2" and S12b, the reaction between the above compounds may be one or more according to the different structures of the compounds, which is not limited by some embodiments of the present disclosure.

The method of preparing the TADF polymer provided by some embodiments of the present disclosure may be used to prepare the TADF polymer provided by some embodiments above. The advantageous effects achieved by the method are the same as the advantageous effects achieved by the TADF polymer, and will not be described herein again.

In some embodiments, the TADF polymer further includes at least one solubilizing group grafted onto the main chain. The method of preparing a TADF polymer with this structure includes:

Preparing a main compound, a TADF compound, and a quantum dot coordinating compound respectively; then mixing the main compound, the TADF compound and the quantum dot coordinating compound to perform reaction(s); and finally, obtaining a product of the reaction as a TADF polymer.

Of course, referring to S1'~S3' above, the main compound, the TADF compound, and the solubilizing compound may also be mixed to perform reaction(s). Since at least one of the main compound and the TADF compound contains at least one quantum dot coordinating group, a TADF polymer containing at least one solubilizing group may be obtained.

Moreover, referring to S1"~S3" above, the main compound containing at least one TADF reactive group, the quantum dot coordinating group, and the solubilizing compound may also be mixed to perform reaction(s), so as to obtain a TADF polymer containing at least one solubilizing group.

Some embodiments of the present disclosure provide a quantum dot material, which includes quantum dots and the TADF polymer above mentioned. The quantum dot coordinating groups in the TADF polymer are bonded to the quantum dots by chemical bonds.

The quantum dots include cadmium quantum dots or cadmium-free quantum dots.

In some embodiments, the quantum dots are cadmium-free quantum dots.

For example, the cadmium quantum dots include at least one of cadmium sulfide (CdS) quantum dots, cadmium selenide (CdSe) quantum dots, cadmium telluride (CdTe) quantum dots, or zinc sulfide (ZnS) quantum dots.

Or, the cadmium quantum dots include quantum dots having an alloy structure with cadmium sulfide (CdS), cadmium selenide (CdSe) or cadmium telluride (CdTe) cores.

Or, the cadmium quantum dots include quantum dots having a core-shell structure with cadmium sulfide (CdS), cadmium selenide (CdSe) or cadmium telluride (CdTe) cores.

For example, the cadmium-free quantum dots include at least one of zinc selenide (ZnSe) quantum dots, indium phosphide (InP) quantum dots, lead sulfide (PbS) quantum dots, copper indium sulfur ($CuInS_2$) quantum dots, zinc oxide (ZnO) quantum dots, perovskite oxides quantum dots (such as $CsPbCl_3$ quantum dots, $CsPbBr_3$ quantum dots, $CsPhI_3$ quantum dots), zinc sulfide (ZnS) quantum dots, indium arsenide (InAs) quantum dots, indium gallium arsenide (InGaAs) quantum dots, indium gallium nitride (InGaN) quantum dots, gallium nitride (GaN) quantum dots, zinc telluride (ZnTe) quantum dots, silicon (Si) quantum dots, germanium (Ge) quantum dots or carbon (C) quantum dots.

Or, the cadmium-free quantum dots include quantum dots having an alloy structure with zinc selenide (ZnSe), indium phosphide (InP), lead sulfide (PbS), copper indium sulfide ($CuInS_2$), zinc oxide (ZnO), perovskite oxides (such as $CsPbCl_3$, $CsPbBr_3$, $CsPhI_3$), indium arsenide (InAs), indium gallium arsenide (InGaAs), indium gallium nitride (InGaN), gallium nitride (GaN), zinc telluride (ZnTe), silicon (Si), germanium (Ge) or carbon (C) cores.

Or, the cadmium-free quantum dots include quantum dots having a core-shell structure with zinc selenide (ZnSe), indium phosphide (InP), lead sulfide (PbS), copper indium sulfide ($CuInS_2$), zinc oxide (ZnO), perovskites (such as $CsPbCl_3$, $CsPbBr_3$, $CsPhI_3$), indium arsenide (InAs), indium gallium arsenide (InGaAs), indium gallium nitride (InGaN), gallium nitride (GaN), zinc telluride (ZnTe), silicon (Si), germanium (Ge) or carbon (C) cores.

The quantum dot material provided in some embodiments of the present disclosure has utilized the TADF properties of the TADF polymer combined with quantum dots, i.e., properties that allow holes and electrons to be recombined into excitons in the TADF polymer. Therefore, the TADF polymer may emit light with a spectrum that overlaps with an absorption spectrum (or an excitation spectrum) of the quantum dots under an action of a voltage. As a result, energy of the TADF polymer may be transferred to the quantum dots by a means of energy transfer such as Foster resonance, and cause the quantum dots to emit light.

Therefore, in the quantum dot material provided by some embodiments of the present disclosure, not only that the quantum dots may emit light by directly recombining holes and electrons into excitons in the quantum dots, but also the quantum dots may emit light due to energy transfer from the TADF polymer to the quantum dots. As a result, the electroluminescence efficiency of the quantum dot material may be effectively improved.

Figure 9:
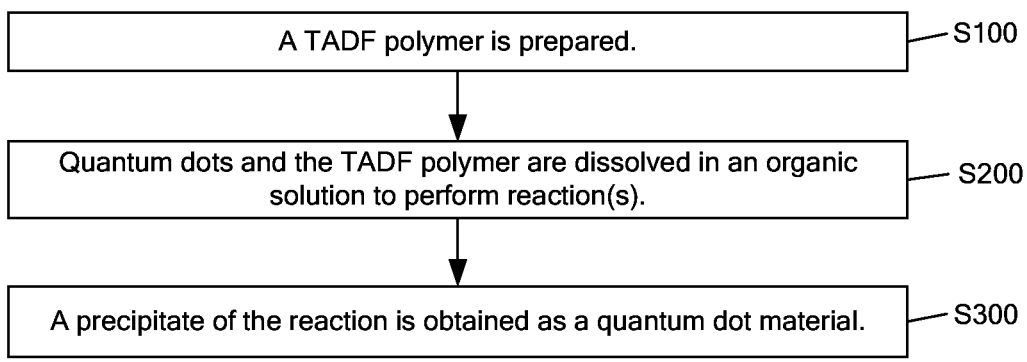
FIG. 9 is a flow diagram of a method of preparing a quantum dot material, in accordance with some embodiments of the present disclosure.

As shown in FIG. 9, some embodiments of the present disclosure provide a method of preparing the quantum dot material, which is used for preparing the quantum dot material described above. The method includes step 100~step 300 (S100~S300).

In S100, a TADF polymer is prepared.

For example, a TADF polymer is prepared in accordance with the method of preparing a TADF polymer described in some of the above embodiments In S200, quantum dots and the TADF polymer are dissolved in an organic liquid to perform reaction(s).

For example, the organic liquid includes chloroform.

In S300, a precipitate of the reaction is obtained as a quantum dot material.

For example, ethyl acetate is added to the chloroform in which the quantum dots and the TADF polymer are dissolved, and the precipitate obtained by mixing the quantum dots and the TADF polymer is dissolved out, centrifuged, and separated to obtain a quantum dot material.

The advantageous effects achieved by the method of preparing a quantum dot material provided by some embodiments of the present disclosure are the same as the advantageous effects achieved by the quantum dot material provided by some of the above embodiments, which will not be described herein again.

Figure 10:
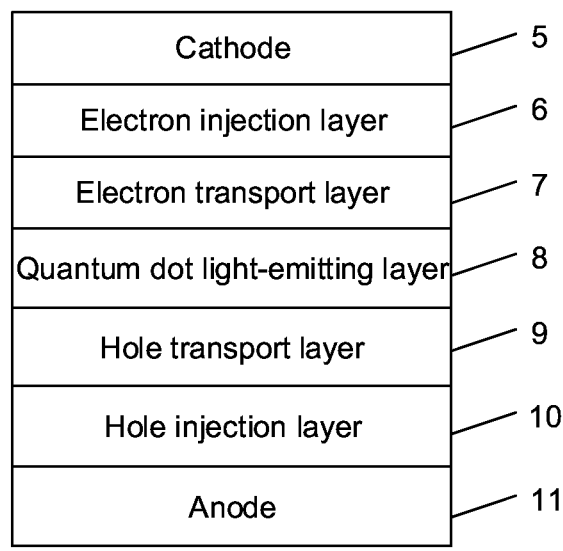
FIG. 10 is a schematic diagram showing a structure of a QLED device, in accordance with some embodiments of the present disclosure.

As shown in FIG. 10, some embodiments of the present disclosure provide a QLED device. The QLED device includes a quantum dot light-emitting layer. A material forming the quantum dot light-emitting layer includes the quantum dot material above mentioned.

The QLED device further includes other functional layers, such as a cathode 5 and an anode 11 disposed opposite to each other, an electron transport layer 7 and an electron injection layer 6 sequentially disposed between the quantum dot light-emitting layer 8 and the cathode 5, and a hole transport layer 9 and a hole injection layer 10 sequentially disposed between the quantum dot light-emitting layer 8 and the anode 11, as shown in FIG. 10.

Of course, a structure of the QLED device is not limited thereto, and other structures may be adopted. For example, a hole blocking layer is further disposed between the quantum dot light-emitting layer 8 and the electron transport layer 7; or, an electron blocking layer is further disposed between the quantum dot light-emitting layer 8 and the hole transport layer 9; or, the quantum dot light-emitting layer 8 is directly disposed on a surface of the anode 11 facing the cathode 5, and only the electron transport layer 7 is disposed between the quantum dot light-emitting layer 8 and the anode 11; or, the quantum dot light-emitting layer 8 is directly disposed on a surface of the cathode 5 facing the anode 11, and only the hole transport layer 9 is disposed between the quantum dot light-emitting layer 8 and the anode 11; etc., which are not limited by some embodiments of the present disclosure.

In some embodiments, a material forming any of the electron injection layer 6, the electron transport layer 7, the hole transport layer 9, the hole injection layer 10, the hole blocking layer, and the electron blocking layer may include an organic small molecule material, a polymer material, an inorganic material, a nano material, or a composite material.

For example, the organic small molecule material includes at least one of tris-[4-(5-phenyl-2-thienyl) benzene] amine, beryllium copper (CuPc), 8-hydroxyquinoline aluminum (Alq3), 8-lithium porphyrin (Liq), 1,3,5-tris-(N-benzene-2-benzimidazole) benzene (TPBI), or the like.

The polymer material includes at least one of PEDOT [poly (3,4-ethylenedioxythiophene)], PEDOT:PSS [poly (3,4-ethylenedioxythiophene):poly ((sodium-p-styrene-sulfonate)], TFB [poly{9,9-dioctylindole-CO—N-(4-butylphenyl) diphenylamine}], PVK (polyvinylcarbazole), or the like.

The inorganic material includes at least one of lithium fluoride (LiF), sodium fluoride (NaCl), or the like.

The nano material includes at least one of nano zinc oxide (ZnO), nano magnesium zinc oxide (ZnMgO), or the like.

The composite material includes at least two of the organic small molecule material, the polymer material, the inorganic material, or the nano material.

In addition, any layer of the QLED device, such as the electron injection layer 6, the electron transport layer 7, the hole transport layer 9, the hole injection layer 10, the hole blocking layer, and the electron blocking layer, may be prepared by any one of a vacuum evaporation method, a solution method, or a transfer print method.

The solution method includes a spin coating and an ink-jet printing; the transfer print method includes a thermal transfer, a laser transfer, or the like, which are not limited by some embodiments of the present disclosure.

For example, in the QLED device provided by some embodiments, the quantum dot material provided by some of the above embodiments may be formulated into a solution or an ink, and the quantum dot light-emitting layer 8 may be formed by a solution method such as the spin coating or the ink jet printing.

In the QLED device provided by some embodiments of the present disclosure, a material forming the quantum dot light-emitting layer includes the quantum dot material above mentioned, so that when a voltage is applied to the cathode 5 and the anode 11 in the QLED device, the electrons and holes may be recombined into excitons in the TADF polymer in the quantum dot light-emitting layer 8. Therefore, the TADF polymer may emit light with a spectrum that overlaps with an absorption spectrum (or an excitation spectrum) of the quantum dots under an action of the voltage. As a result, energy of the TADF polymer may be transferred to the quantum dots by a means of energy transfer such as Foster resonance, and cause the quantum dots to emit light. In this way, an electro-luminescence efficiency of the quantum dot light-emitting layer 8 may be improved.

Therefore, in the QLED device provided by some embodiments of the present disclosure, not only that the quantum dots in the quantum dot light-emitting layer 8 may emit light by directly recombining holes and electrons into excitons in the quantum dots, but also the quantum dots may emit light due to energy transfer from the TADF polymer in the quantum dot light-emitting layer 8 to the quantum dots. As a result, the electro-luminescence efficiency of the QLED device may be effectively improved.

In order to more clearly illustrate the TADF polymer, the quantum dot material, the QLED device and preparation methods thereof provided in some of the above embodiments, two kinds of TADF polymers are listed below, which are respectively described in detail in Example 1 and Example 2.

Example 1

A molecular structure of a TADF polymer is shown below:

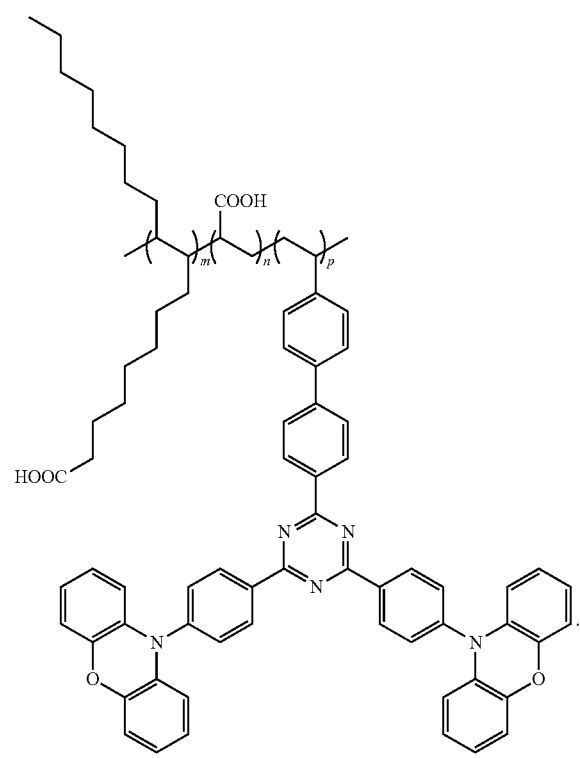

Referring to FIG. 3, the molecule is an atactic copolymer, in which the main chain 1 is a polyethylene chain; the TADF reactive group 2 is a phenoxazine-triazine-phenoxazine, and the number of the TADF reactive groups is p; the quantum dot coordinating group 3 is a carboxyl group, and the number of the quantum dot coordinating groups is n; the solubilizing group 4 includes a carboxyoctyl group and an octyl group, and the number of the solubilizing groups is m.

A carboxyoctyl group in the solubilizing group 4 adopts a long-chain structure to enhance a solubilization effect. The carboxyl group in the carboxyoctyl group may be used as a quantum dot coordinating group, and both the carboxyl group in the carboxyoctyl group and the carboxyl group in the aforementioned quantum dot coordinating group 3 may be used to combine the quantum dots by coordination bonds.

The TADF polymer is synthesized by the following method.

First, 10 mmol of p-bromobenzonitrile ($C_7H_4BrN$) is dissolved in 50 mmol of trifluoromethanesulfonic acid ($CF_3SO_3H$), and the mixture is reacted at 60° C. for 12 hours. After the reaction is completed, reactants are poured into water to form a mixed system, and solids in the mixed system are washed out. The solids are subjected to suction filtration to obtain a dried filter cake. The dried filter cake is purified by a column chromatography method to obtain a compound a, as shown below:

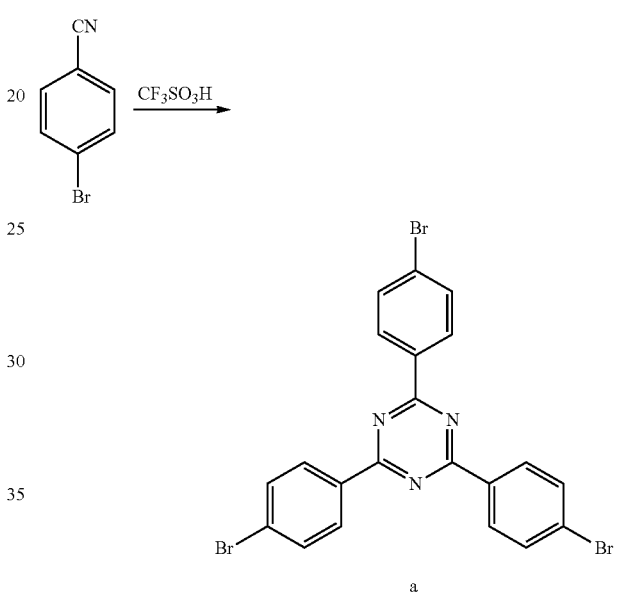

Next, 10 mmol of compound a and 19 mmol of phenoxazine ($C_{12}H_9NO$) are dissolved in DMF (N, N-dimethylformamide), and 30 mmol of potassium carbonate ($K_2CO_3$) and an appropriate amount of catalyst such as cuprous oxide (CuO) are added to the solution. The mixture is reacted under reflux for 24 hours. After the reaction is completed, insoluble matter in the reaction system is filtered; the filtrate is poured into water, and solids are dissolved out; then the solids are subjected to suction filtration and purification by a column chromatography method to obtain a compound b, as shown below:

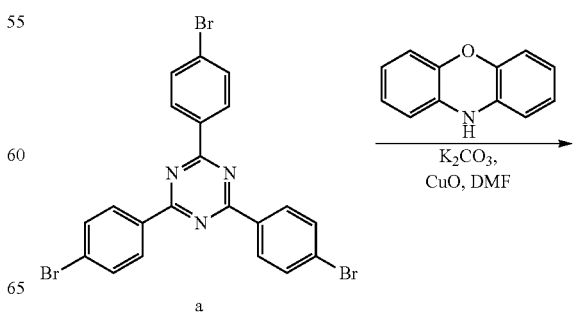

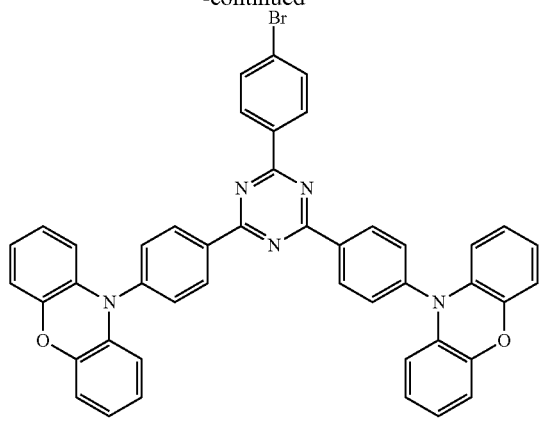

b

Then, 10 mmol of the compound b and 12 mmol of vinylbenzeneboronic acid ($C_8H_9BO_2$) are dissolved in 30 ml of toluene, and 20 mmol of potassium carbonate, an appropriate amount of catalyst such as tetrakis triphenylphosphine palladium ($Pd[P(C_6H_5)_3]_4$) and 30 ml of water are added to the solution. The mixture is heated to 100° C. and reacted for 8 hours. After the reaction is completed, the liquid is separated by means of extraction to obtain an organic phase, for example, an aqueous phase is extracted by using ethyl acetate, and the organic phase is combined with the extraction liquid. After the organic phase is evaporated, a column chromatography method is performed to obtain a compound c, as shown below:

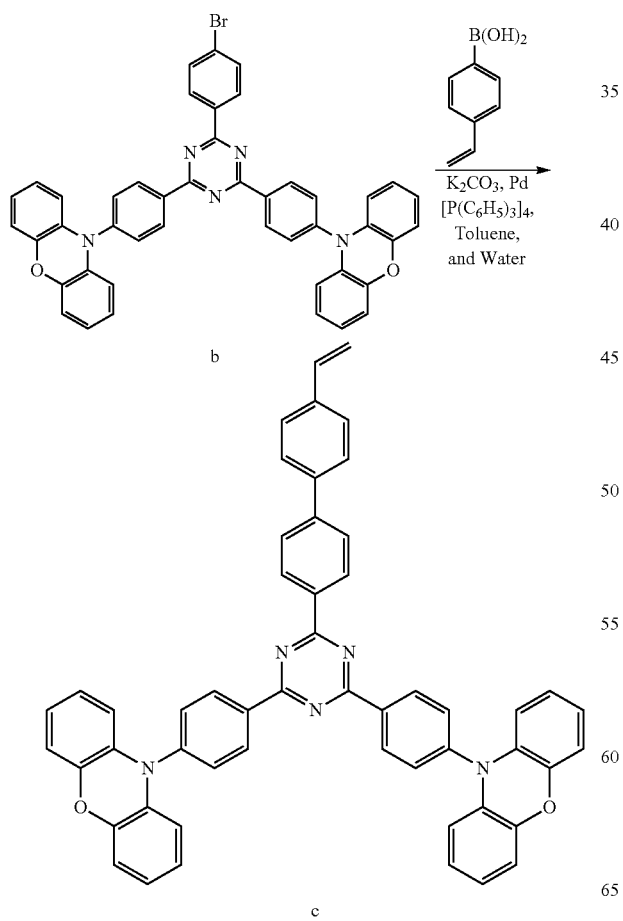

Finally, after the compound c is mixed with oleic acid and acrylic acid in a certain ratio, the mixture is dissolved in toluene; and azobisisobutyronitrile (AIBN) is added as an initiator in a volume ratio of 1/200. The mixture is reacted and polymerized at 90° C. After the reaction was completed, methanol is added to the reaction products, and solids are dissolved out. The solid is dissolved in toluene, and methanol is added again. This process is repeated several times, so as to obtain a purified TADF polymer d, as shown below.

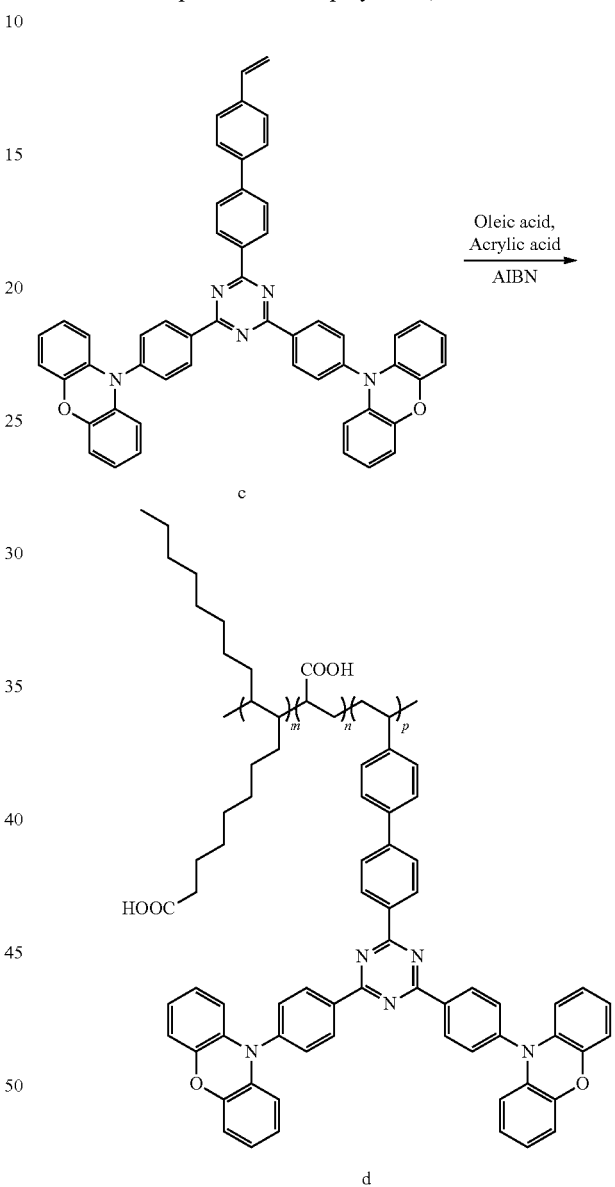

Since a non-conjugated portion of the TADF polymer does not affect an energy level and photophysical properties of the material including the TADF polymer, a TADF core (i.e., portion with the TADF properties) of the TADF polymer d prepared by the above method is calculated theoretically by using the density functional theory (TD-DFT), and the results are as follows:

| HOMO | LUMO | $\Delta E_{st}$ | $\lambda_{em}$ |
|---|---|---|---|
| −5.7 eV | −3.4 eV | 0.06 eV | 550 nm |

That is, in the TADF polymer provided in Example 1, a value of an energy level of the HOMO orbital is 5.7 eV, a value of an energy level of the LUMO orbital is 3.4 eV, and an energy level difference $\Delta E_{st}$ between singlet state and triplet state is 3.4 eV. A maximum emission wavelength $\lambda_{em}$ is 550 nm and corresponds to green light.

Thus, $\Delta E_{st}$ of the TADF polymer provided in Example 1 is extremely small at only 0.06 eV, which means the TADF polymer has strong TADF properties. Moreover, the TADF polymer has a maximum emission wavelength of 550 nm, which corresponds to green light. A spectrum of the TADF polymer highly overlaps with absorption spectra of quantum dots that emit yellow light, orange light, and red light respectively. Thus, the TADF polymer provided in Example 1 may be combined by coordination bonds with quantum dots with a spectrum ranging from yellow light to red light.

For example, the quantum dots are CdSe nanoparticles, and the quantum dot material is prepared by the following method: the chloroform in which an appropriate amount of TADF polymer d is dissolved is stirred at room temperature for 1 hour. Ethyl acetate is added to the stirred chloroform, and a precipitate obtained by mixing the CdSe nanoparticles and the TADF polymer d is dissolved out, centrifuged, and separated. The obtained precipitate is dissolved in chloroform to obtain a new type of CdSe nanoparticle solution with TADF properties. Therefore, the CdSe nanoparticle solution may be used to fabricate QLED devices with high electroluminescence efficiency.

Example 2

A molecular structure of a TADF polymer is shown below:

Referring to FIG. 4, the molecule is an atactic copolymer, in which the main chain 1 is a main chain including an alkenyl group, a phenyl group and a carbazole; the TADF reactive group 2 is a carbazole-sulfone group-carbazole, and the number of the TADF reactive groups is p; the quantum dot coordinating group 3 is an aminomethyl group, and the number of the quantum dot coordinating groups is m.

A butoxy group in the solubilizing group 4 adopts a long-chain structure to enhance the solubilization effect, and the number of the solubilizing groups is n.

The TADF polymer is synthesized by the following method.

First, 10 mmol of carbazole ($C_{12}H_9N$) is dissolved in 50 mmol of chloroform ($CHCl_3$); 60 mmol of aluminum trichloride ($AlCl_3$) is added to the solution; and 25 mmol of t-butyl chloride ($C_4H_9Cl$, also known as t-BuCl) is added dropwise to the solution in an ice water bath. The mixture is reacted under reflux for 12 hours. After the reaction is completed, the reactants are poured into water, and a crude product is obtained by evaporation after extraction. The crude product is recrystallized from ethanol to obtain a compound a', as shown below:

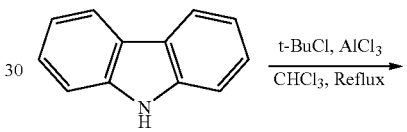

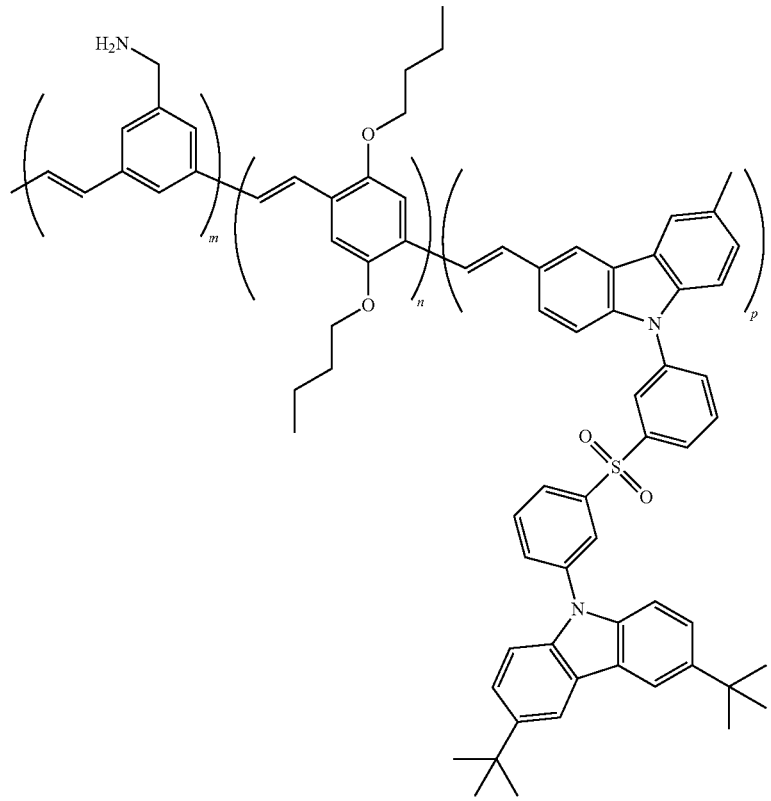

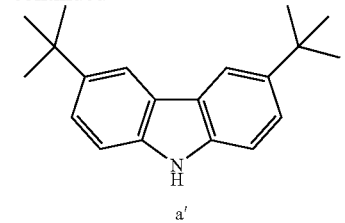

a'

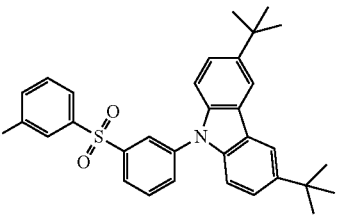

b'

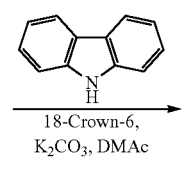

Next, 10 mmol of compound a' and 9 mmol of compound t' are dissolved in DMAc (dimethylacetamide), and 30 mmol of potassium carbonate and 1 mmol of 18-crown-6 ether ($C_{12}H_{24}O_6$, also known as 18-Crown-6) are added to the solution. The mixture is reacted under reflux for 12 hours. After the reaction is completed, the reactants are poured into water, and a crude product is obtained by suction filtration. The crude product is purified by a column chromatography method to obtain a compound b', as shown below:

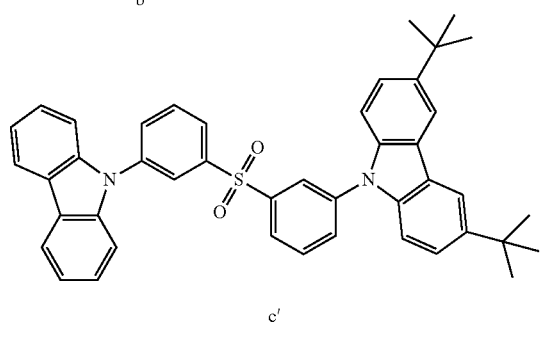

c'

Then, 5 mmol of compound c' is added to acetic acid ($CH_3COOH$), and 15 mmol of potassium iodide (KI) and 15 mmol of potassium iodate ($KIO_3$) are added to the solution. The mixture is reacted under reflux for 12 hours. After the reaction is completed, the reactants are poured into water, and a crude product is obtained by suction filtration. The crude product is subjected to purification by a column chromatography method to obtain a compound d', as shown below.

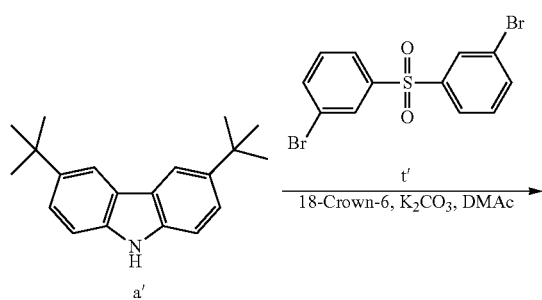

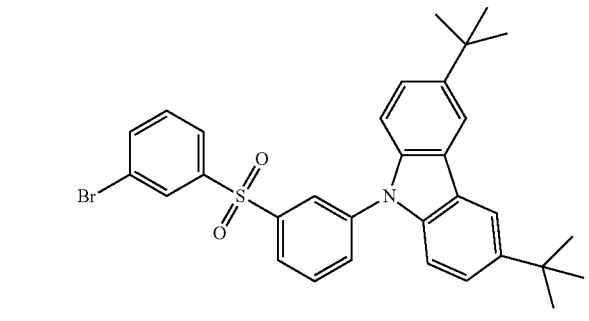

b'

The compound t' is synthesized by the following method.

10 mmol of diphenyl sulfone is dissolved in sulfuric acid, and a total amount of 20 mmol of NBS (N-bromosuccinimide) brominating reagent is added to the solution in portions. The mixture is reacted under reflux for 5 hours. After the reaction is completed, the reactants are poured into water, and solids are dissolved out; the solids are subjected to suction filtration and purification by a column chromatography method to obtain a purified compound t'.

Again, 10 mmol of compound b' and 9 mmol of carbazole are dissolved in DMAc, and 30 mmol of potassium carbonate and 1 mmol of 18-Crown-6 ether are added. The mixture is reacted under reflux for 12 hours. After the reaction is completed, the reactants are poured into water, and a crude product is obtained by suction filtration. The crude product is subjected to purification by a column chromatography method to obtain a compound c', as shown below:

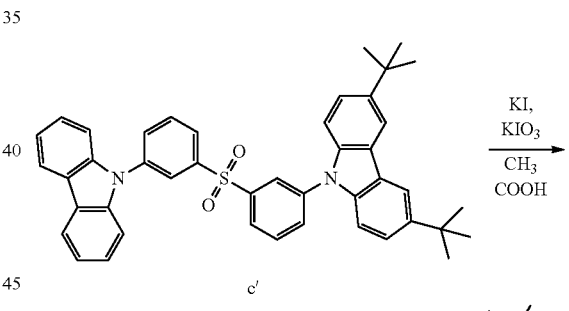

c'

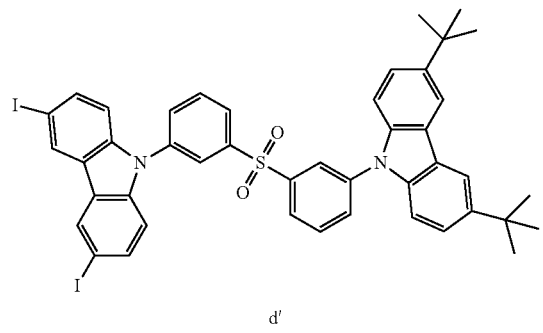

d'

Finally, compound d', compound x', compound y' and compound z' are dissolved in dry DMF (N, N-dimethylformamide) in a certain ratio, and potassium carbonate, palladium acetate ($Pd(OAc)_2$) and tetrabutylammonium bromide ($C_{16}H_{36}BrN$, also known as $Bu_4NBr$) are added to the solution. The mixture is reacted at 120° C. for 12 hours under protection of nitrogen. After the reaction is completed, the reactants are poured into water, and a crude product is obtained by suction filtration. The crude product is dissolved in toluene, and methanol is added to the obtained toluene solution to obtain a precipitate; the precipitate is further dissolved in toluene, and methanol is added to the obtained toluene solution again. This process is repeated several times to obtain a purified TADF polymer e', as shown below:

As for synthesis of the above compound y', reference may be made to Xiaobo Huang, Jie Meng, Yu Dong, et al. Polymer-based fluorescence sensor incorporating triazole moieties for Hg2+ detection via click reaction. [J]. *Polymer*, 2010, 51, 14, 3064-3067.

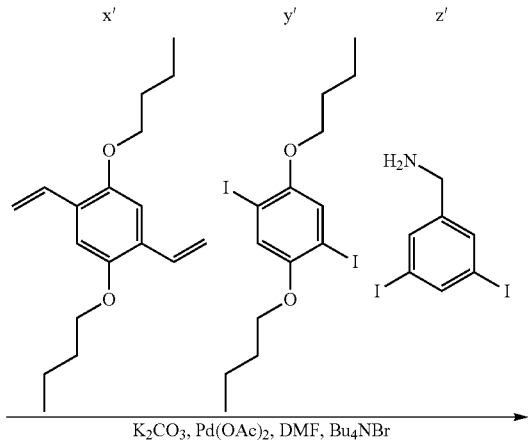

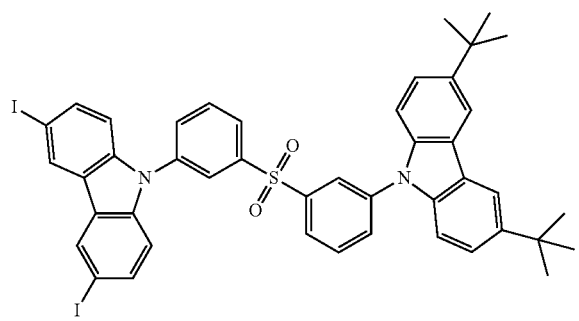

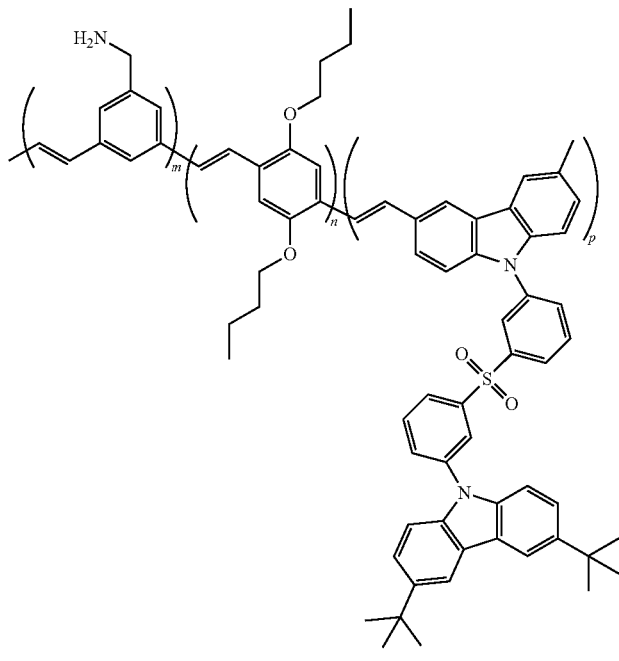

As for synthesis of the above compound x', reference may be made to Chun Kou, Xiaolong He, Xueyu Jiang, et al. Novel isoindigo—based conjugated polyelectrolytes: Synthesis and fluorescence quenching behavior with water-soluble poly(p-phenylenevinylene)s. [J]. *Journal of Polymer Science, Part A: Polymer Chemistry*. 2015, 53, 19, 2223-2237.

As for synthesis of the above compound z', reference may be made to Magnus Baiter, Shiming Li, Jesper R. Nilsson, et al. An All-Photonic Molecule-Based Parity Generator/Checker for Error Detection in Data Transmission. [J]. *Journal of the American Chemical Society*, 2013, 135, 28, 10230-10233.

Since the non-conjugated portion of the TADF polymer does not affect the energy level and photophysical properties of the material including the TADF polymer, a TADF core (i.e., portion with the TADF properties) of the TADF polymer e' prepared by the above method is calculated theoretically by using the density functional theory (TD-DFT), and the results are as follows:

| HOMO | LUMO | $\Delta E_{st}$ | $\lambda_{em}$ |
|---|---|---|---|
| −5.4 eV | −1.6 eV | 0.22 eV | 450 nm |

That is, in the TADF polymer provided in Example 2, a value of an energy level of the HOMO orbital is 5.4 eV, a value of an energy level of the LUMO orbital is 1.6 eV, and the energy level difference $\Delta E_{st}$ between singlet and triplet states is 0.22 eV. The maximum emission wavelength $\lambda_{em}$ is 450 nm and corresponds to blue light.

Thus, $\Delta E_{st}$ of the TADF polymer provided in Example 2 is extremely small at only 0.22 eV, which means the TADF polymer has strong TADF properties. Moreover, the TADF polymer has a maximum emission wavelength of 450 nm, which corresponds to blue light. The spectrum of the TADF polymer highly overlaps with absorption spectra of quantum dots that emit green light, yellow light, and red light respectively. Thus, the TADF polymer provided in Example 2 may be combined by coordination bonds with quantum dots with a spectrum ranging from green light to red light.

For example, the quantum dots are CdSe nanoparticles, and the quantum dot material is prepared by the following method.

The chloroform in which an appropriate amount of the TADF polymer e' is dissolved is stirred at room temperature for an hour. Ethyl acetate is added to the stirred chloroform, and a precipitate obtained by mixing the CdSe nanoparticles and the TADF polymer e' are dissolved out, centrifuged, and separated. The obtained precipitate is redissolved in chloroform to obtain a new type of CdSe nanoparticle solution with TADF properties. Therefore, the CdSe nanoparticle solution may be used to fabricate QLED devices with high electroluminescence efficiency.

For example, after the CdSe nanoparticle solutions with TADF properties provided in the above Example 1 and Example 2 are obtained, the QLED device is fabricated by the following method.

In step 1000, the glass substrate provided with an ITO (Indium tin oxide) transparent electrode (i.e., the anode in the QLED) is cleaned.

A glass substrate is ultrasonically cleaned with deionized water and ethanol for 20 minutes. Next, the glass substrate is quickly blow-dried using a nitrogen gun, and the blow-dried glass substrate is subjected to ozone treatment for 10 minutes, so as to clean a surface of the ITO transparent electrode on the glass substrate, and to enhance a work function of the ITO transparent electrode.

In step 2000, PEDOT:PSS (PEDOT:PSS is an aqueous solution including a high molecular polymer PEDOT and a high molecular polymer PSS; PEDOT is a polymer of EDOT (3,4-ethylenedioxythiophene monomer), and PSS is polystyrene sulfonate) is spin-coated on the cleaned glass substrate at a speed of 4000 rpm for 45 seconds in the air. The spin-coated glass substrate is annealed at 120° C. for 20 minutes. The non-volatile liquid on the glass substrate is dried to form a hole injection layer. The hole injection layer is located on a surface of the ITO transparent electrode away from the glass substrate.

In step 3000, the glass substrate on which a hole injection layer is formed is transferred into a vacuum glove box, and a TFB (poly(9,9-dioctylfluorene-co-N-(4-butylphenyl)di-phenylamine)) solution with a concentration of 10 mg/ml is spin-coated on the hole injection layer at a speed of 2000 rpm for 45 seconds. The spin-coated glass substrate is annealed in the vacuum glove box at 150° C. for 30 minutes to form a hole transport layer.

In step 4000, a CdSe nanoparticle solution with TADF properties in Example 1 or Example 2 is spin-coated on the hole transport layer at a speed of 2500 rpm to form a quantum dot light-emitting layer. A concentration of the CdSe nanoparticle solution is 10 mg/ml, and the spin coating time is 60 seconds.

In step 5000, a ZnMgO ethanol solution is spin-coated on the quantum dot light-emitting layer at a speed of 1,500 rpm to form an electron transport layer. A concentration of ZnMgO in the ZnMgO ethanol solution is 30 mg/ml, and the spin coating time is 45 seconds.

In step 6000, the glass substrate formed with the electron transport layer is placed in a vacuum evaporation chamber, and lithium fluoride (LiF) is evaporated on the electron transport layer to form an electron injection layer.

In step 7000, an aluminum electrode (i.e., the cathode of the QLED device) is evaporated on the electron injection layer to obtain a QLED device.

Figure 11:
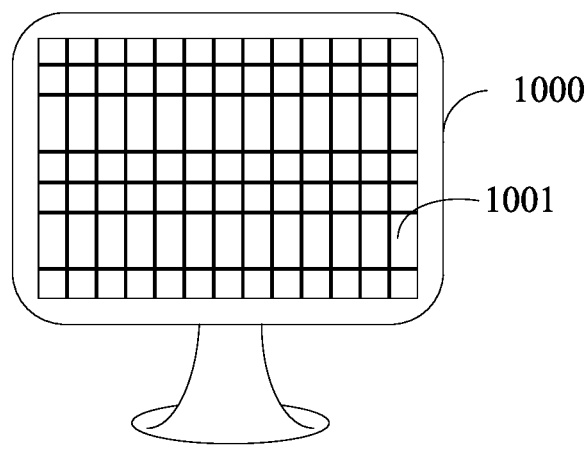
FIG. 11 is a schematic diagram of a display device, in accordance with some embodiments of the present disclosure.

Some embodiments of the present disclosure further provide a display device. As shown in FIG. 11, the display device 1000 includes at least one QLED device 1001 described in some of the above embodiments. The display device has the same advantageous effects as those of the QLED device 1001 described above, which will not be described herein again.

For example, the display device may be an electronic paper, a mobile phone, a tablet computer, a television, a display, a notebook computer, a digital photo frame, a navigator, or any other product or component having a display function.

In the description of the above embodiments, specific features, structures, materials or characteristics may be combined in any suitable manner in any one or more embodiments or examples.

The foregoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A (thermally activated delayed fluorescence) TADF polymer, comprising:
   a main chain including a plurality of aromatic groups; and
   at least one TADF reactive group and at least one quantum dot coordinating group respectively grafted onto the main chain, wherein
   each of the at least one TADF reactive group includes: at least one electron-donating group and at least one electron-withdrawing group correspondingly bonded to the at least one electron-donating group; the at least one electron-donating group includes at least one aromatic group; and
   the at least one TADF reactive group and the main chain share at least one of the at least one aromatic group.

2. The TADF polymer according to claim 1, wherein
each of the at least one aromatic group includes at least one of a carbazolyl group, a diphenylamino group, a triphenylamino group, or a phenothiazine group; and
each of the at least one electron-withdrawing group includes at least one of a triazine group, a sulfone group, a cyano group, or a phenyl polycyano group.

3. The TADF polymer according to claim 1, wherein each of the at least one quantum dot coordinating group includes at least one of amino group(s), hydroxyl group(s), carboxyl group(s), mercapto group(s), thioether group(s), phosphine(s), or phosphine oxide(s).

4. The TADF polymer according to claim 1, further comprising: at least one solubilizing group grafted onto the main chain.

5. The TADF polymer according to claim 4, wherein each of the at least one solubilizing group includes at least one of ethyl group(s), n-butyl group(s), t-butyl group(s), n-octyl group(s), tert-butylphenyl group(s), methoxy group(s), or n-butoxy group(s).

6. The TADF polymer according to claim 5, wherein a chemical structural formula of the TADF polymer is:

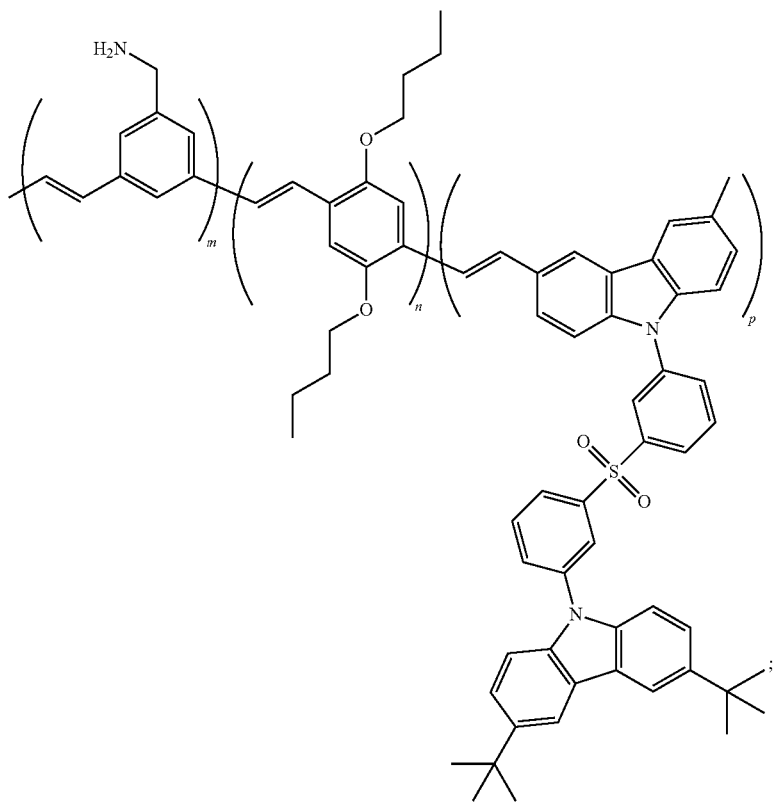

wherein
p is a number of TADF reactive groups grafted onto the main chain, m is a number of quantum dot coordinating groups grafted onto the main chain, and n is a number of solubilizing groups grafted onto the main chain.

7. The TADF polymer according to claim 1, wherein the main chain includes a main chain formed by polymerization from at least one of an ester, an ether, an amide, or a hydrocarbon compound.

8. The TADF polymer according to claim 7, wherein
the hydrocarbon compound includes at least one of an alkane, an alkene, an alkyne, or an aromatic compound; wherein
the aromatic compound includes at least one of benzene ring(s), furan(s), thiophene(s), carbazole(s), triphenylamine(s), fluorene(s), or spirofluorene(s).

9. The TADF polymer according to claim 1, wherein the main chain includes one of a homopolymer main chain, an alternating copolymer main chain, an atactic copolymer main chain, a block copolymer main chain, or a graft copolymer main chain.

10. A method of preparing a TADF polymer, comprising:
preparing a main compound for forming a main chain, a TADF compound, and a quantum dot coordinating compound respectively;
mixing the main compound, the TADF compound and the quantum dot coordinating compound to perform reaction(s); and
obtaining a product of the reaction as a TADF polymer; or,
preparing a main compound for forming a main chain and a TADF compound respectively, at least one of the main compound and the TADF compound containing at least one quantum dot coordinating group;
mixing the main compound and the TADF compound to perform reaction(s); and
obtaining a product of the reaction as a TADF polymer; or,
preparing a main compound for forming a main chain and a quantum dot coordinating group respectively, the main compound containing at least one TADF reactive group;

mixing the main compound and the quantum dot coordinating compound to perform reaction(s); and obtaining a product of the reaction as a TADF polymer, wherein the TADF polymer contains at least one TADF reactive group, and each TADF reactive group includes at least one electron-donating group and at least one electron-withdrawing group correspondingly bonded to the at least one electron-donating group; the at least one electron-donating group includes at least one aromatic group; the main chain includes a plurality of aromatic groups; and the at least one TADF reactive group and the main chain share at least one of the at least one aromatic group, and the step of preparing a main compound for forming a main chain, the main compound containing at least one TADF reactive group, includes:

preparing an initial compound for forming a main chain, and an electron-withdrawing compound respectively, the initial compound containing at least one aromatic group;

dissolving the initial compound and the electron-withdrawing compound in an organic liquid to perform reaction(s);

obtaining a product of the reaction; and purifying the product of the reaction to obtain a main compound containing at least one TADF reactive group.

11. A quantum dot material, comprising:
quantum dots; and
the TADF polymer according to claim 1; wherein
the quantum dots are combined with the TADF polymer through the at least one quantum dot coordinating group in the TADF polymer.

12. The quantum dot material according to claim 11, wherein
an emission spectrum of the TADF polymer at least partially overlaps with an absorption spectrum of the quantum dots;
or,
the emission spectrum of the TADF polymer at least partially overlaps with the excitation spectrum of the quantum dots.

13. The quantum dot material according to claim 11, wherein
the quantum dots include cadmium quantum dots or cadmium-free quantum dots; wherein
the cadmium quantum dots include:
at least one of cadmium sulfide quantum dots, cadmium selenide quantum dots, or cadmium telluride quantum dots;
or, quantum dots having an alloy structure with cadmium sulfide, cadmium selenide or cadmium telluride cores;
or, quantum dots having a core-shell structure with cadmium sulfide, cadmium selenide or cadmium telluride cores;
the cadmium-free quantum dots include:
at least one of zinc selenide quantum dots, indium phosphide quantum dots, lead sulfide quantum dots, copper indium sulfur quantum dots, zinc oxide quantum dots, perovskite oxides quantum dots, zinc sulfide quantum dots, indium arsenide quantum dots, indium gallium arsenide quantum dots, indium gallium nitride quantum dots, gallium nitride quantum dots, zinc telluride quantum dots, silicon quantum dots, germanium quantum dots, or carbon quantum dots;

or, quantum dots having an alloy structure with zinc selenide, indium phosphide, lead sulfide, copper indium sulfide, zinc oxide, perovskite oxides, indium arsenide, indium gallium arsenide, indium gallium nitride, gallium nitride, zinc telluride, silicon, germanium, or carbon cores, or, quantum dots having a core-shell structure with zinc selenide, indium phosphide, lead sulfide, copper indium sulfide, zinc oxide, perovskite oxides, indium arsenide, indium gallium arsenide, indium gallium nitride, gallium nitride, zinc telluride, silicon, germanium, or carbon cores.

14. A method of preparing a quantum dot material, comprising:
preparing the TADF polymer in accordance with the method of preparing a TADF polymer according to claim 10;
dissolving quantum dots and the TADF polymer in an organic liquid to perform reaction(s); and
obtaining a precipitate of the reaction as a quantum dot material.

15. A quantum dot light-emitting diode (QLED) device, comprising a quantum dot light-emitting layer, a material forming the quantum dot light-emitting layer including the quantum dot material according to claim 11.

16. A display device, comprising at least one QLED device according to claim 15.

17. A (thermally activated delayed fluorescence) TADF polymer, comprising:
a main chain; and
at least one TADF reactive group, at least one quantum dot coordinating group and at least one solubilizing group respectively grafted onto the main chain, wherein
a chemical structural formula of the TADF polymer is:

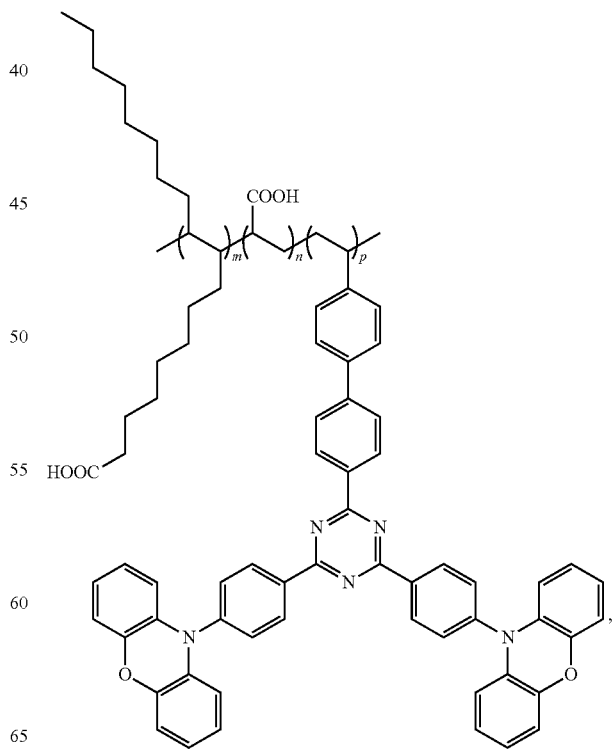

wherein p is a number of TADF reactive groups grafted onto the main chain, n is a number of quantum dot coordinating groups grafted onto the main chain, and m is a number of solubilizing groups grafted onto the main chain.

18. A method of preparing the TADF polymer according to claim 17, comprising:
   preparing a main compound for forming a main chain, a TADF compound, a quantum dot coordinating compound and a solubilizing compound respectively, wherein the main chain is a polyethylene chain, the TADF compound includes a phenoxazine-triazine-phenoxazine, the quantum dot coordinating compound includes a carboxyl group, and the solubilizing compound includes a carboxyoctyl group and an octyl group;
   mixing the main compound, the TADF compound, the quantum dot coordinating compound and the solubilizing compound to perform reaction(s); and
   obtaining a product of the reaction as the TADF polymer.

19. A quantum dot material, comprising:

quantum dots; and the TADF polymer according to claim 17; wherein the quantum dots are combined with the TADF polymer through the at least one quantum dot coordinating group in the TADF polymer.

20. A method of preparing a quantum dot material, comprising:

preparing the TADF polymer in accordance with the method of preparing a TADF polymer according to claim 18;

dissolving quantum dots and the TADF polymer in an organic liquid to perform reaction(s); and obtaining a precipitate of the reaction as a quantum dot material.

* * * * *